United States Patent
Ko et al.

(10) Patent No.: US 7,005,389 B2
(45) Date of Patent: Feb. 28, 2006

(54) METHODS FOR FORMING A THIN FILM ON AN INTEGRATED CIRCUIT DEVICE BY SEQUENTIALLY PROVIDING ENERGIES TO ACTIVATE THE REACTANTS

(75) Inventors: Chang-Hyun Ko, Seoul (KR); Ki-Hyun Hwang, Gyeonggi-do (KR); Hyo-Jung Kim, Busan-si (KR)

(73) Assignee: Samsung Electronics Co., Ltd., (KR)

( * ) Notice: Subject to any disclaimer, the term of this patent is extended or adjusted under 35 U.S.C. 154(b) by 17 days.

(21) Appl. No.: 10/814,553

(22) Filed: Mar. 31, 2004

(65) Prior Publication Data

US 2005/0032372 A1 Feb. 10, 2005

(30) Foreign Application Priority Data

Apr. 2, 2003 (KR) .................... 10-2003-0020786

(51) Int. Cl.
*H01L 21/22* (2006.01)
(52) U.S. Cl. .................. 438/758; 438/776; 438/777; 438/778; 438/787; 438/788
(58) Field of Classification Search ............. 438/758, 438/776–778, 787–788
See application file for complete search history.

(56) References Cited

U.S. PATENT DOCUMENTS

| 5,324,553 A * | 6/1994 | Ovshinsky et al. ......... 427/571 |
| 6,576,564 B1 * | 6/2003 | Agarwal ..................... 438/758 |
| 2002/0066411 A1 | 6/2002 | Chiang et al. |

FOREIGN PATENT DOCUMENTS

| KR | 1989700174 | 1/1989 |
| KR | 10-2002-0088597 A | 11/2002 |
| KR | 10-2002-0091643 A | 12/2002 |

OTHER PUBLICATIONS

Korean Office Action corresponding to application No. 20030020786, dated Apr. 29, 2005.

* cited by examiner

*Primary Examiner*—Dung A. Le
(74) *Attorney, Agent, or Firm*—Myers Bigel Sibley & Sajovec

(57) ABSTRACT

Methods for forming a thin film on an integrated circuit device including providing energy to reactants in a deposition chamber to activate the reactants. The activated reactants are then deposited on the substrate to form a thin film on the substrate. The reactants selected may be selectively activated so that different thin films are formed in a single chamber thereby reducing processing time.

25 Claims, 12 Drawing Sheets

METHODS FOR FORMING A THIN FILM ON AN INTEGRATED CIRCUIT DEVICE BY SEQUENTIALLY PROVIDING ENERGIES TO ACTIVATE THE REACTANTS

CROSS REFERENCE TO RELATED APPLICATION

This application claims priority under 35 USC § 119 to Korean Patent Application No. 2003-20786, filed on Apr. 2, 2003, the contents of which are herein incorporated by reference in its entirety as if set forth fully herein.

BACKGROUND OF THE INVENTION

1. Field of the Invention

The present invention relates to methods for forming a thin film on a substrate. More particularly, the present invention relates to methods for forming a thin film on an integrated circuit device by providing reactants and energies in a deposition chamber.

2. Description of the Related Art

Chemical Vapor Deposition (CVD) is a popular method of material delivery for integrated circuit device fabrication because of the potential high throughput, good conformal coverage, potential for selectivity, and/or relatively low cost. In the CVD process, a precursor molecule incorporating the desired growth element is used to deliver atoms of that element to a surface. A potential precursor molecule can have such desirable qualities as a high selectivity of surface types, and the promotion of smooth conformal growth. Ideally, the precursor molecule adsorbs on the surface, diffuses, and dissociates into the growth element and other molecular fragments. These fragments desorb from the surface leaving only the growth element on the surface. For this to be the case, the precursor-surface match should be a good one and the surface temperature should be above the precursor dissociation temperature but below the dissociation temperature for its fragments.

It may be desirable for a dielectric layer formed on an integrated circuit device to have a high capacitance. The dielectric layer may be uniformly formed to reduce or prevent defects from occurring therein. Thus, it may be desirable for the dielectric layer to have excellent step coverage and uniformity. A dielectric layer formed through a typical CVD process or a typical physical vapor deposition (PVD) process may have inferior step coverage because the PVD process thermally provides reactants to a substrate. Moreover, the dielectric layer formed by the CVD process may have a difficulty in controlling of step coverage because the CVD process simultaneously uses a plurality of reactants. As a result, a thin film, such as the dielectric layer, formed through the PVD process or the CVD process may have low reliability.

Recently, methods for forming a thin film having improved step coverage and uniformity have been produced by an epitaxial growth process, a cyclic CVD process, a digital CVD process and an advanced CVD process. However since the formation of the layer by the epitaxial growth process may take for a long time due to the growth of the molecular units, it may be undesirable to employ the epitaxial growth process in integrated circuit fabricating processes.

Atomic layer chemical vapor deposition (AL-CVD) or atomic layer deposition (ALD) can also used for depositing thin films. ALD is similar to CVD except that the substrate is sequentially exposed to one reactant at a time. ALD is performed by introducing a first reactant on to a heated substrate whereby it forms a monolayer on the surface of the substrate. Excess reactant is pumped out. Next a second reactant is introduced and reacts with the first reactant to form a monolayer of the desired film via a self-limiting surface reaction. The process may be self-limiting since the deposition reaction halts once the initially adsorbed (physi- or chemi-sorbed) monolayer of the first reactant has fully reacted with the second reactant. Finally, the excess second reactant is evacuated. The above sequence of events comprises one deposition cycle. The desired film thickness is obtained by repeating the deposition cycle the desired number of times.

In contact-heating methods used in the typical CVD and ALD processes, a substrate is heated to form a layer on the substrate. Problems may occur with these processes because the temperature of the substrate may not be readily controlled according to a temperature of reactants in the contact-heating method. This lack of control may be due to the problems associated with transmitting a heat to the substrate. Thus, the substrate may be subject to various delays due to changes in the temperature as it is moved from one deposition chamber to another when multi-layer films are formed. The additional deposition chambers may also drive up the costs of producing a multi-layer film.

Additionally, methods that can reduce the time for controlling a reacting temperature have been studied. A method for controlling the reacting temperature in an ALD process is disclosed in U.S. Patent Publication No. 2002/0066411 (hereinafter the '66411 Application). The '66411 Application utilizes a single, fixed substrate temperature setpoint as the principal means of controlling or driving the deposition reaction. The '66411 Application does this by allowing one part of the ALD process sequence (e.g., adsorption of the first reactant) to occur at a first temperature, generally lower, while allowing another part of the ALD process sequence (e.g., reaction between the second reactant with the adsorbed first reactant) to occur at a second temperature, generally higher). The '66411 Application allows for the first temperature chosen to be a lower level such that decomposition or desorption of the adsorbed first reactant does not occur, and the second temperature can be chosen to be of a higher level. Unfortunately by rapidly heating the substrate, the speed for cooling the substrate may not be as controllable which may lead to errors in the deposition process.

A method for forming a thin film using a microwave has been disclosed in Korean Patent Laid Open Publication No. 2002-0091643. This application discloses a thin film that may be formed on a substrate at a relatively low temperature. The substrate is also directly heated so that time for cooling the substrate may be too long. Moreover, a single layer may be only formed in a single chamber under this method. In other words, although time for heating a substrate may be reduced, time for cooling the heated substrate may be conversely increased. Additionally, the number of chambers may increase proportional to an increased number of kinds of layers. As a result, the unit cost of an integrated circuit device may increase due to the decrease of the efficiency in integrated circuit fabrication.

SUMMARY OF THE INVENTION

A method for forming a thin film on a substrate comprising simultaneously providing reactants at a surface of a substrate disposed in a chamber, sequentially providing energies to the reactants to separately activate molecules of the reactants, and depositing the activated molecules on the surface of the substrate to form a thin film. Addition embodiments can include providing a first energy to the reactants to selectively activate a first reactant among the reactants, depositing the activated first reactant on the surface of the substrate to form a chemisorbed layer, providing a second energy to the reactants comprising the first chemisorbed layer to increase the temperature of the surface of the first chemisorbed layer, and depositing a second reactant among the reactants on the first chemisorbed layer to form the thin film. Other embodiments may include providing a third energy to the reactants comprising the first thin film to increase the temperature of the first thin film, depositing a third reactant among the reactants on the first thin film, the temperature of which has been increased, to form a second chemisorbed layer, providing a fourth energy to the reactants comprising the second chemisorbed layer to increase the temperature of the second chemisorbed layer, and then depositing a fourth reactant among the reactants on the second chemisorbed layer to form a second thin film on the first thin film.

Other embodiments of the present invention may include methods for forming a thin film on a substrate comprising introducing a first reactant into a chamber, providing a first energy to the first reactant to activate the first reactant, depositing the activated first reactant on the substrate to form a chemisorbed layer, exhausting the first reactant remaining in the chamber, introducing a second reactant to the chamber, providing a second energy to the chemisorbed layer to increase the temperature of the reactants comprising the chemisorbed layer, and then depositing the second reactant on the chemisorbed layer to form a thin film on the substrate. Additional embodiments may include wherein the thin film is a first thin film, the method further comprising exhausting the second reactant remaining in the chamber, introducing a third reactant, providing a third energy to the first thin film to increase the temperature of the reactants comprising the first thin film, depositing a third reactant on, the first thin film, the temperature of which has been increased, to form a second chemisorbed layer, exhausting the third reactant remaining in the chamber, introducing a fourth reactant, providing a fourth energy to the second chemisorbed layer to, increase the temperature of the reactants comprising the second chemisorbed layer, depositing the fourth reactant on the second chemisorbed layer, the temperature of which has been increased, to form a second thin film on the first thin film, and exhausting the fourth reactant remaining in the chamber. This process can be repeated to form multilayer films.

A method for forming a thin film on a substrate in a chamber comprising introducing a first reactant to a polar surface of a substrate in a deposition chamber, providing a first energy to the substrate to increase the temperature of the substrate, providing a second energy to the first reactant to activate the first reactant, depositing the first reactant on the surface of the substrate to form a first chemisorbed layer, exhausting the first reactant remaining in the chamber, providing a second reactant to the chamber, providing a third energy to the reactants comprising the first chemisorbed layer to increase the temperature of the reactants comprising the first chemisorbed layer, providing a fourth energy to the second reactant to activate the second reactant, and then depositing the second reactant on the first chemisorbed layer to form a thin film on the substrate.

DETAILED DESCRIPTION OF THE EMBODIMENTS

Figure 1A:
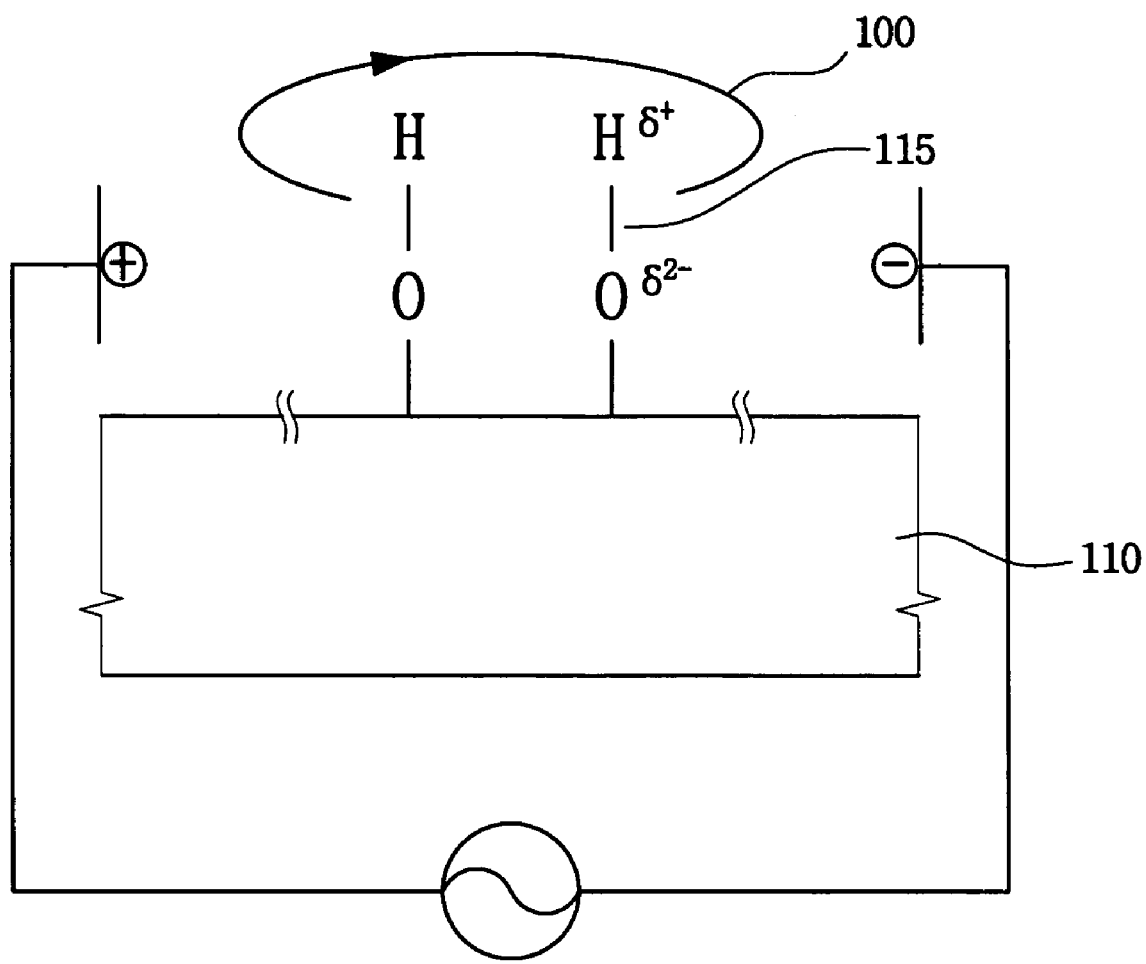
FIGS. 1A to 1E illustrate chemical reactions for forming a thin film according to embodiments of the present invention.

The foregoing and other aspects of the present invention will now be described in more detail with respect to the embodiments described herein. It should be appreciated that the invention may be embodied in different forms and should not be construed as limited to the embodiments set forth herein. Rather, these embodiments are provided so that this disclosure will be thorough and complete, and will fully convey the scope of the invention to those skilled in the art.

It will be understood that when an element such as a layer, a region or an integrated circuit device is referred to as being "on" another element, it can be directly on the other element or intervening elements may also be present. It will be understood that if part of an element, such as a surface of a conductive line, is referred to as "outer", it is closer to the outside of the integrated circuit than other parts of the element. Furthermore, relative terms such as "beneath" may be used herein to describe a relationship of one layer or region to another layer or region relative to an integrated circuit device or a base layer as illustrated in the figures. It will be understood that these terms are intended to encompass different orientations of the device in addition to the orientation depicted in the figures. Finally, the term "directly" means that there are no intervening elements.

The present invention includes methods for forming a thin film on a substrate such as an integrated circuit device. In embodiments of the present invention, reactants may be simultaneously or subsequently introduced into a single chamber. Energies can then be provided to the reactants to selectively activate a specific reactant among the reactants. Diverse thin films can be formed in the single chamber under atmosphere for selectively activating the reactants so that processing time for fabricating an integrated circuit device may be reduced.

Embodiments of the present invention can include simultaneously introducing four reactants in a deposition chamber to produce a thin film on a substrate. These reactants can form a thin film on the substrate in a number of methods. One such method can include providing a first energy to a first reactant so that the first reactant becomes activated. The first reactant can be activated through collisions, vibrations and/or rotations of molecules created by the kinetic energy of the first reactant. The energy provided to the first reactant can correspond to an electric field. The energy can include an alternating current or light energy such as a microwave or infrared rays. The activated first reactant can then be deposited on to a substrate to form a first chemisorbed layer on the substrate.

A second energy can then be provided to the first chemisorbed layer to activate the reactants comprising the first chemisorbed layer to have a first temperature lower than the dissociation temperature of molecules in the first chemisorbed layer. The first chemisorbed layer is activated by the rotations and/or vibrations of the materials comprising the first chemisorbed layer. The second energy provided can correspond to an electric field, which can include an alternating current or light energy. When both the first and second energies provided correspond with an alternating current, a first reactant provided to the deposition chamber, or a second reactant provided to the deposition chamber comprises a polar material. After the first reactant is deposited, the second reactant is deposited on the activated first chemisorbed layer to form a first thin film on the substrate. Additional energy can be further provided to the surface of the substrate and the second reactant.

A third energy is then provided to the first thin film to activate the first thin film. The third energy provided also can correspond to an electric field wherein said energy can include an alternating current or light energy. A third reactant is then deposited on the activated first thin film to form a second chemisorbed layer. Next, a fourth energy is provided to the second chemisorbed layer to activate the second chemisorbed layer. Again, the fourth energy provided can correspond to an electric field wherein said energy can include an alternating current or light energy. The second chemisorbed layer is activated so that it has a lower dissociation temperature of molecules. The fourth reactant is then deposited on the activated second layer to form a second thin film on the first thin film. Additionally, energy can be further provided to activate the third and fourth reactants. Additionally, the substrate may be activated for aiding the formation of the chemisorbed layer. Multiple films can be formed on the substrate by repeating the above procedures.

Embodiments of the present invention also include introducing a first reactant to a deposition chamber wherein a substrate is disposed in the chamber. A first energy can then be provided to the first reactant to activate the first reactant. The first reactant is activated through collisions, vibrations and/or rotations of molecules of the first reactant caused by the kinetic energy of the first reactant. The activated first reactant can be selectively deposited on the substrate to form a first chemisorbed layer on the substrate. Additionally, materials of the first chemisorbed layer can be further activated. The remaining first activated reactant in the chamber can then be exhausted.

A second reactant can then be introduced to the chamber and substrate. A second energy may be provided to the first chemisorbed layer to activate the reactants comprising the first chemisorbed layer to have a temperature lower than the dissociation temperature of reactant molecules in the first chemisorbed layer. The first chemisorbed layer is activated through rotations and/or vibrations of materials in the first chemisorbed layer. The first and second energies can include an alternating current field or light energy. When the first and second energies are both an electric field, either the first reactant or the second reactant may have polarity. The second reactant is then deposited on the activated first chemisorbed layer to form a first thin film on the substrate. The second activated reactant remaining in the chamber can then be exhausted.

Next, a third reactant is introduced on to the first thin film. A third energy can be provided to the first thin film to activate the reactants comprising the first thin film wherein the temperature of the first thin film is lower than the dissociation temperature of the reactant molecules in the first thin film. The third reactant is then deposited on the activated first thin film to form a second chemisorbed layer. The third reactant remaining in the chamber can then be exhausted.

A fourth reactant can then be introduced on to the second chemisorbed layer by providing a fourth energy to the second chemisorbed layer. The fourth energy can activate the second chemisorbed layer. The fourth reactant can be deposited on the activated second chemisorbed layer to form a second thin film. After the fourth reactant is deposited, the remaining reactants in the chamber can be exhausted. Additionally, energy may be further provided for activating the third and fourth reactants. By repeating the process multiple times, multi-layer films can be formed on the substrate.

Additional embodiments of the present invention can include introducing a first reactant, substituted to have polarity on the surface of a substrate in a deposition chamber. A first energy can be provided at the surface of the substrate to activate substituents on the surface of the substrate. A second energy can then be provided to selectively activate the first reactant. The activated first reactant can then be deposited on the surface of the substrate to form a chemisorbed layer. The remaining activated first reactant in the chamber can then be exhausted. Next, a second reactant can be introduced on to the chemisorbed layer. A third energy can then be provided to the chemisorbed layer to activate the deposition layer. Then a fourth energy can be provided to the second reactant to selectively activate the second reactant. The second activated reactant can then be deposited on the chemisorbed layer to form a thin film.

The layers formed in some embodiments of the present invention may have improved step coverage and uniformity.

Additionally, some embodiments of the present invention allow for thin multi-layers having desired kinds and thickness to be formed in a single chamber at a readily controllable temperature. In some embodiments of the present invention, a temperature of a substrate is controlled through the motion of the molecules so that a heated portion may be provided on the surface of the substrate. Accordingly, processing time for fabricating an integrated circuit device may be reduced.

The present invention is explained in greater detail in the Examples that follow. These examples are intended as illustrative of the invention and are not to be taken are limiting thereof.

EXAMPLE 1

FIGS. 1A to 1E illustrate chemical reactions for forming a thin film according to embodiments of the present invention. FIG. 1A illustrates a hydroxyl group 115 adhering to a surface of a substrate 110 having a polarity. The surface of the substrate 110 may be substituted for the hydroxyl group 115 through a typical cleaning process. A microwave applied to the surface of the substrate 110 generates an alternating current field. The alternating current field induces a rotary motion of the hydroxyl group 115. The hydroxyl group 115 then collides with other hydroxyl groups by the rotary motion to dissipate heat. The substrate 110 is maintained at a constant temperature by controlling a frequency and a power of the microwave.

Figure 1B:
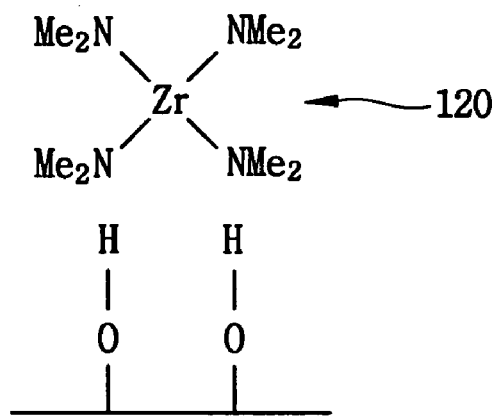

FIG. 1B illustrates the reactants introduced on to the surface of the substrate including a first metal precursor 120 to form a first dielectric layer in accordance with the following reaction equation (1).

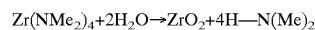
$$Zr(NMe_2)_4 + 2H_2O \rightarrow ZrO_2 + 4H-N(Me)_2 \qquad (1)$$

Wherein Me represents —CH₃.

Figure 1C:
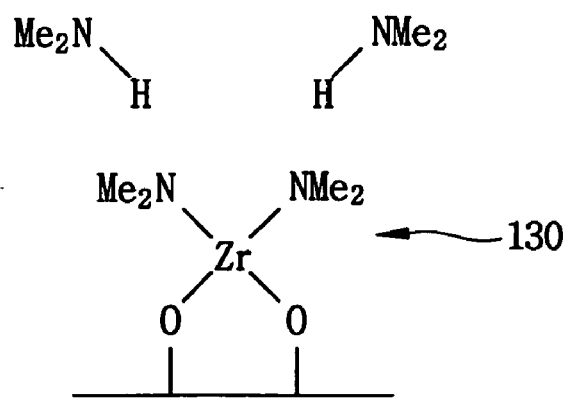

FIG. 1C depicts $Zr(NMe_2)_4$ introduced on the substrate. $Zr(NMe_2)_4$ is activated by the heat dissipated from the surface of the substrate. Activated $Zr(NMe_2)_4$ is chemisorbed on the surface of the substrate to form a chemisorbed material 130. As noted in FIG. 1A, the surface of the substrate is substituted for the hydroxyl group. Alternatively, an infrared ray may irradiate the first metal precursor. The reactants that do not participate in the chemical reaction, but remain in the chamber, are exhausted.

Figure 1D:
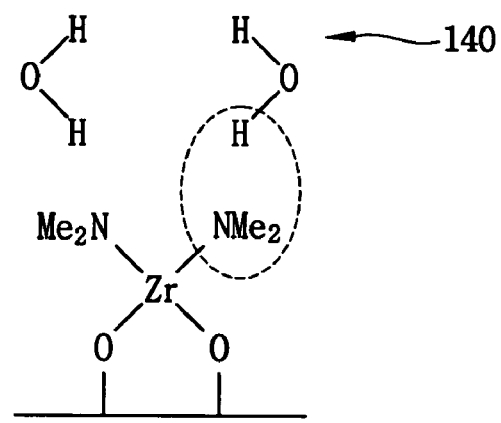
Figure 1E:
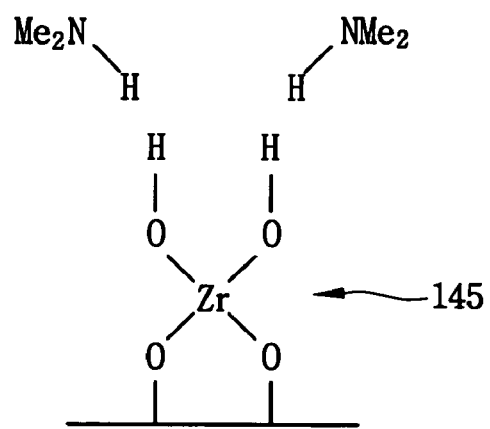

FIG. 1D shows a water vapor ($H_2O$) 140 introduced on to the chemisorbed material. FIG. 1E illustrates that both ends of the water vapor and the chemisorbed material are mutually substituted. This figure also illustrates that the end of the chemisorbed material is substituted for the hydroxyl group to form the first dielectric layer 145 including $ZrO_2$. Any reactants, which do not participate in the formation of the first dielectric layer and remain in the chamber, are exhausted. The remaining material forms a thin film on the substrate.

Additionally, thin films comprising multi-layers having a desired kind and thickness may be formed by repetitive processes in which the reactant is introduced and then chemisorbed. The hydroxyl group may also be removed by a typical annealing process. The energy source utilized for activating the reactant may be used according to characteristics of the reactant.

EXAMPLE 2

Figure 2A:
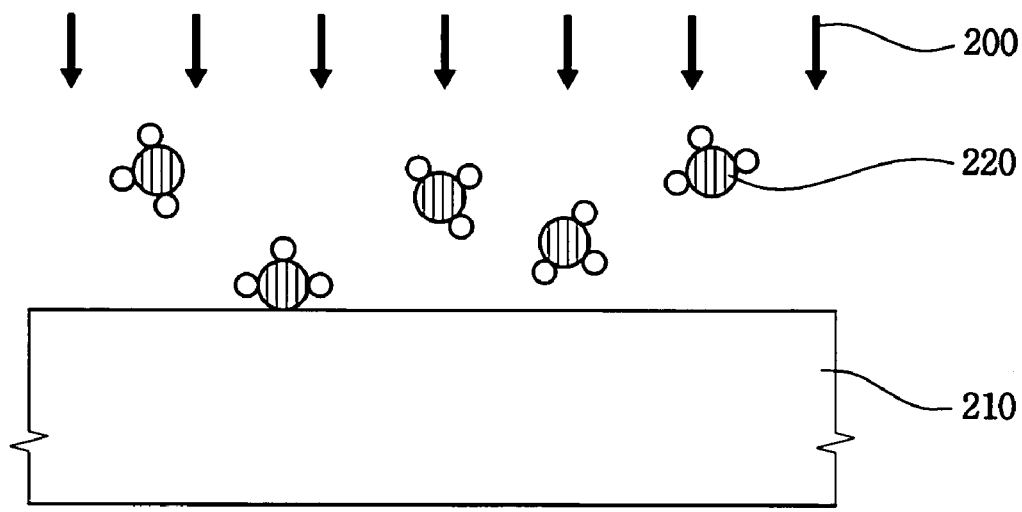
FIGS. 2A to 2D depict additional chemical reactions that illustrate methods for forming a thin film according to embodiments of the present invention.

FIGS. 2A to 2D illustrate an additional method for forming a thin film according to embodiments of the present invention. FIG. 2A illustrates reactants that are simultaneously introduced on to a substrate 210 in a deposition chamber. These reactants may be introduced based on their dielectric layer. FIG. 2A illustrates that the reactants do not react with each other. Instead, an infrared ray 200 having a natural wavelength for separately driving the reactants is selectively irradiated to the reactants so as to subsequently activate the reactants. FIG. 2A depicts the activated reactants including a first metal precursor 220 which are introduced on to the substrate 210 to form a first dielectric layer in accordance with the following reaction equation (2).

$$2Al(CH_3)_3 + O_3 \rightarrow Al_2O_3 + 3C_2H_6 \quad (2)$$

A first infrared ray 200 having a wave number for driving $Al(CH_3)_3$ is irradiated to the reactants.

Figure 2B:
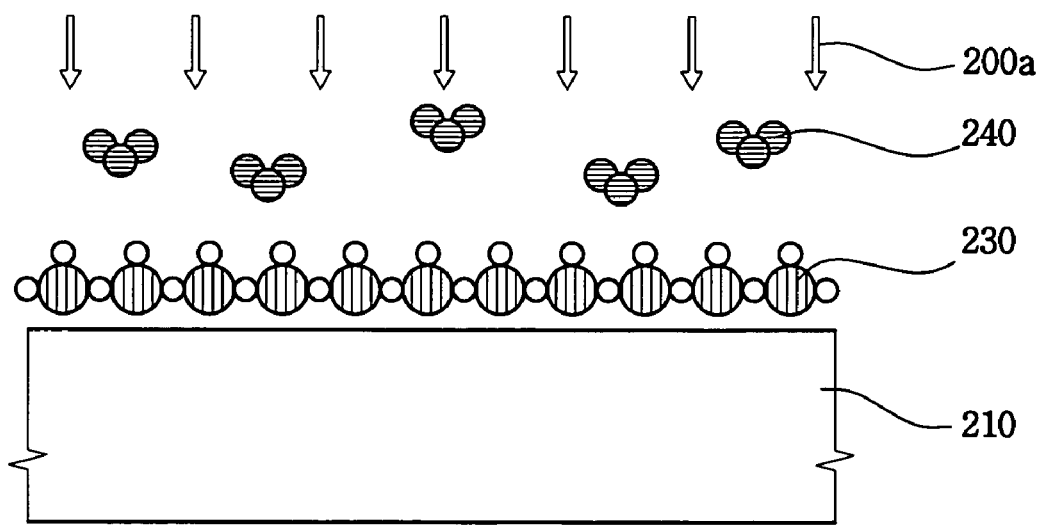

FIG. 2B illustrates that after $Al(CH_3)_3$ collides with other molecules it becomes activated. Activated $Al(CH_3)_3$ is chemisorbed on to the substrate 210 to form a chemisorbed layer 230. A second infrared ray 200a having a wave number for activating $O_3$ 240 is then irradiated to the chemisorbed layer 230.

Figure 2C:
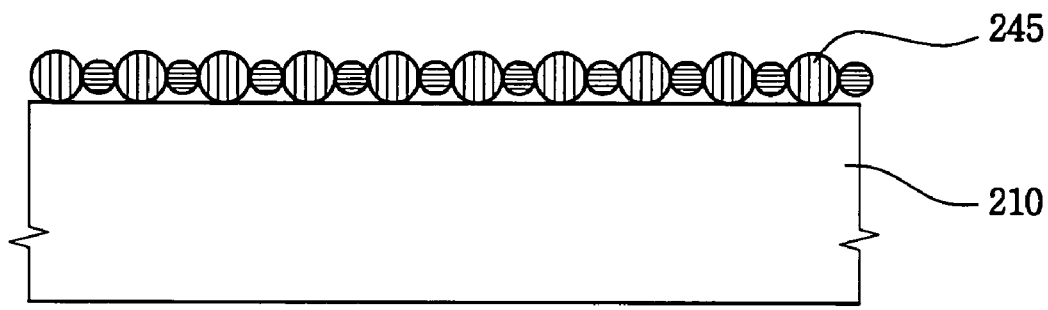
Figure 2D:
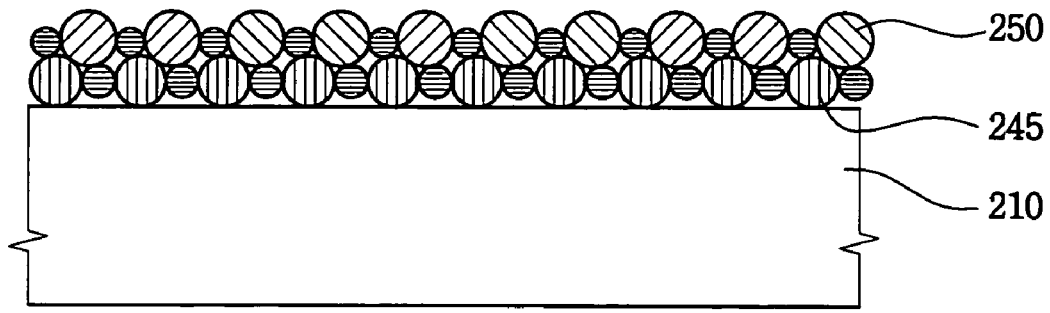

FIG. 2C depicts $O_3$ activated by the second infrared ray to form a first dielectric layer 245 including $Al_2O_3$. FIG. 2D illustrates that the reactants including a second metal precursor, react with the first dielectric layer 245 to form a second dielectric layer 250 in accordance with following reaction equation (3)

$$HfCl_4 + 2H_2O \rightarrow HfO_2 + 4HCl \quad (3)$$

A third infrared ray then irradiates $HfCl_4$ to activate $HfCl_4$. Activated $HfCl_4$ is then chemisorbed on the first dielectric layer 245. A fourth infrared ray then irradiates $H_2O$ to form a second dielectric layer 250 including $H_2O$. The remaining reactants in the chamber are then exhausted. This process allows for thin multi-layers having various desired kinds and thickness to be formed by repetitive processes in which the reactant is introduced and then chemisorbed. Alternatively, thin multi-layers may be formed in a single chamber using an atomic layer deposition (ALD) process using the above method.

EXAMPLE 3

Figure 3A:
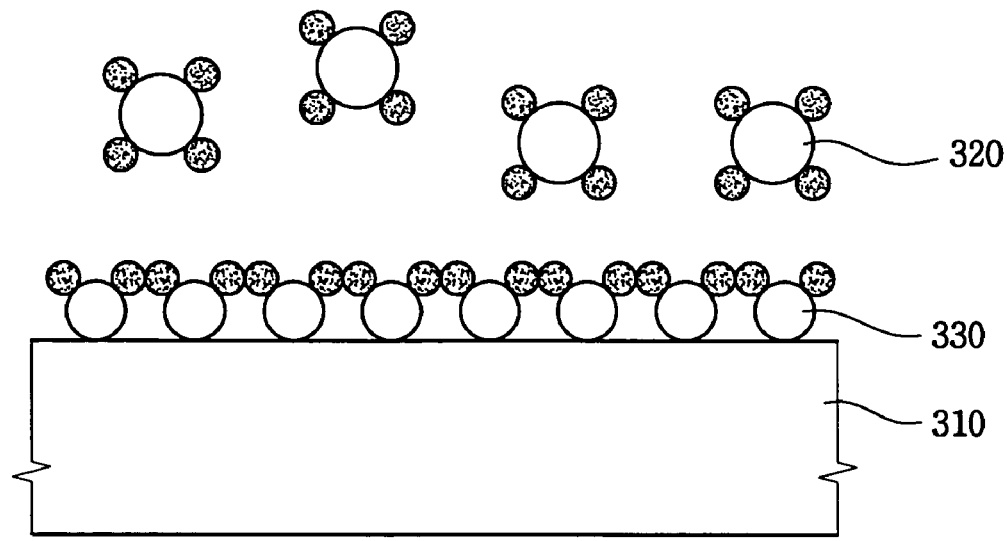
FIGS. 3A to 3F illustrate further chemical reactions for forming a thin according to embodiments of the present invention.

FIGS. 3A to 3F illustrate additional embodiments for forming a thin film. FIG. 3A illustrates a substrate 310 disposed in a chamber. A microwave was applied to the surface of the substrate 310 to generate an alternating current field. The alternating current field induces a rotary motion of hydroxyl groups introduced into the chamber. The hydroxyl groups collide with each other by the rotary motion to dissipate heat. Here, the substrate 310 may be maintained at a uniform temperature by controlling the frequency and power of the microwave. Reactants including a first metal precursor 320 are then introduced on to the surface of the substrate 310 to form a first dielectric layer in accordance with the following reaction equation (4).

$$Zr(Cl)_4 + 2H_2O \rightarrow ZrO_2 + 4HCl \quad (4)$$

The first metal precursor 320 including $Zr(Cl)_4$ is introduced on the substrate 310. $Zr(Cl)_4$ is activated by the heat dissipated from the surface of the substrate 310. Activated $Zr(Cl)_4$ is chemisorbed on the surface of the substrate 310, which is substituted for the hydroxyl group, to form a first chemisorbed layer 330. Alternatively, an infrared ray may be irradiated to the first metal precursor 320.

Figure 3B:
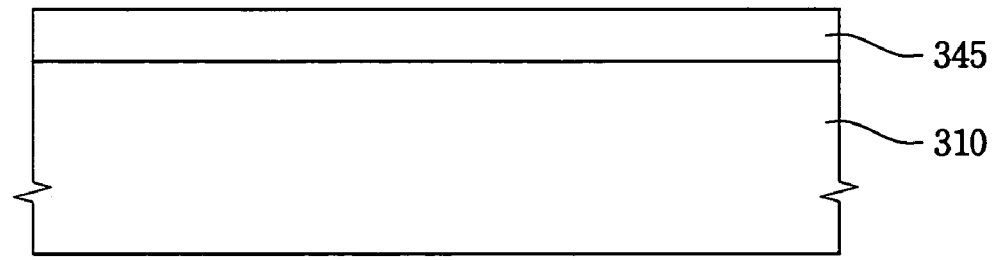

FIG. 3B illustrates $Zr(Cl)_4$ that remains in the chamber without participating in the chemical reaction is exhausted. A water vapor ($H_2O$) is introduced on to the substrate 310. Both ends of the water vapor and the first chemisorbed layer are mutually substituted. The end of the first chemisorbed layer is substituted for the hydroxyl group to form the first dielectric layer 345 including $ZrO_2$. The water vapor that does not participate in the formation of the first dielectric layer 345 remains in the chamber and it is exhausted.

Figure 3C:
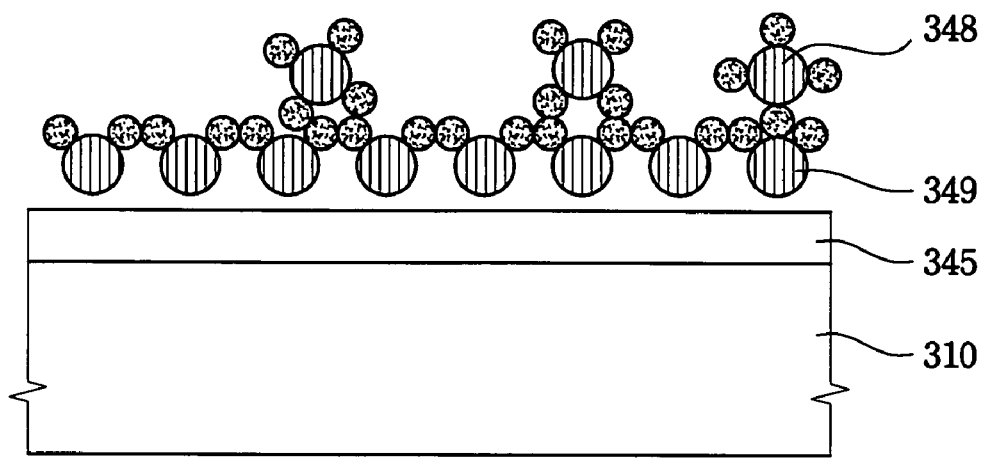

FIG. 3C demonstrates reactants including a second metal precursor 348 that are introduced on to the first dielectric layer 345 to form a second dielectric layer in accordance with following reaction equation (5).

$$Hf(Cl)_4 + 2H_2O \rightarrow HfO_2 + 4HCl \quad (5)$$

$Hf(Cl)_4$ is introduced on the substrate 310. $Hf(Cl)_4$ is activated by the heat dissipated from the surface of the substrate 310. Activated $Hf(Cl)_4$ is then chemisorbed on the first dielectric layer 345 to form a second chemisorbed layer 349.

Figure 3D:
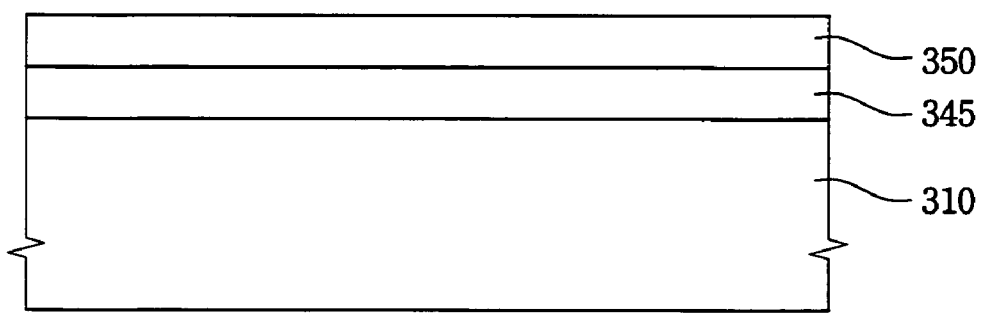

FIG. 3D depicts $Hf(Cl)_4$ which does not participate in the formation of the second chemisorbed layer and remains in the chamber is exhausted. Ozone as an oxidizer is introduced on to the second chemisorbed layer 349 to form a second dielectric layer 350 including $HfO_2$.

Figure 3E:
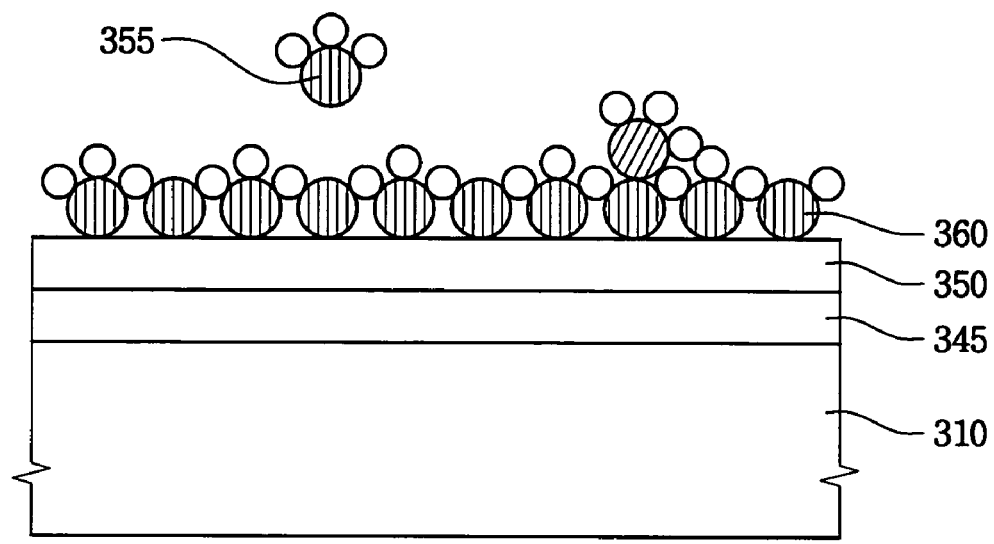

FIG. 3E depicts the reactants which do not participate in the formation of the second dielectric layer 350 and remain in the chamber are exhausted. Reactants including a third metal precursor 355 are introduced on to the second dielectric layer 350 to form a third dielectric layer in accordance with following reaction equation (6).

$$2Al(CH_3)_3 + O_3 \rightarrow Al_2O_3 + 3C_2H_6 \quad (6)$$

$Al(CH_3)_3$ is introduced on to the substrate 310. An infrared ray having a wave number for driving $Al(CH_3)_3$ is irradiated to Al(CH$_3$)$_3$ to selectively activate Al(CH$_3$)$_3$. Activated Al(CH$_3$)$_3$ is chemisorbed on the substrate 310 to form a third chemisorbed layer 360.

Figure 3F:
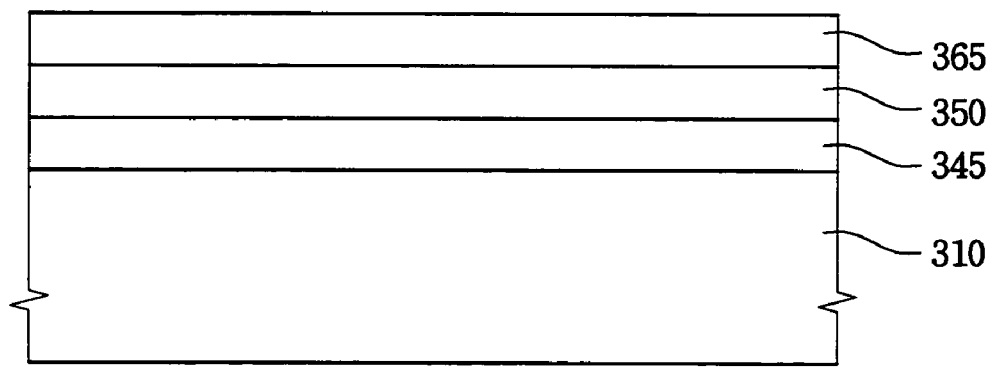

FIG. 3F illustrates that the reactants that do not participate in the formation of the third chemisorbed layer and remain in the chamber are exhausted. O$_3$ is then introduced on to the third chemisorbed layer to form the third dielectric layer 365 including Al$_2$O$_3$. The reactants, which do not participate in the formation of the third dielectric layer and remain in the chamber are then exhausted.

Multiple thin films having desired kinds and thickness may be formed using repetitive processes in which the reactant is introduced and then chemisorbed. The hydroxyl group may also be removed through a typical annealing process. The energy source for activating the reactant may be used according to characteristics of the reactant.

EXAMPLE 4

Figure 4A:
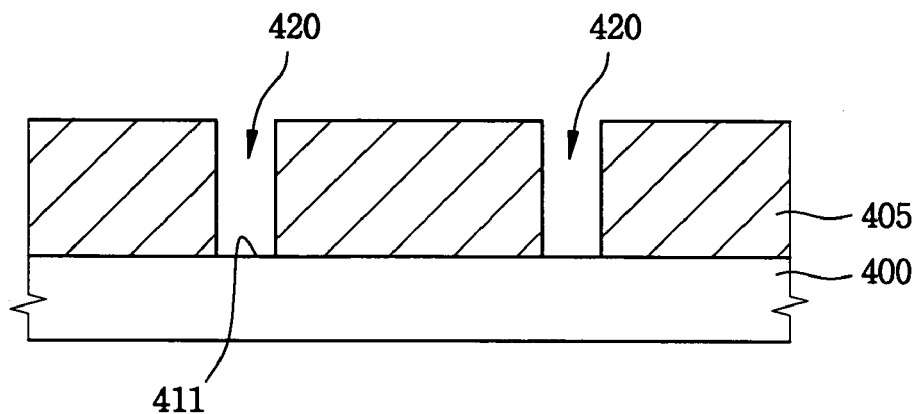
FIGS. 4A to 4H depict cross sectional views of an integrated circuit device formed by embodiments of the present invention according to embodiments of the present invention.

FIGS. 4A to 4H are cross sectional views illustrating a method for forming a thin film on an integrated circuit device. FIG. 4A illustrates a first insulating layer 405 formed on a substrate 400 having a pattern thereon. The first insulating layer 405 is etched for exposing an upper face of the substrate 400 to form first openings 420 exposing portions of the substrate 400. The substrate is exposed to open air 411.

Figure 4B:
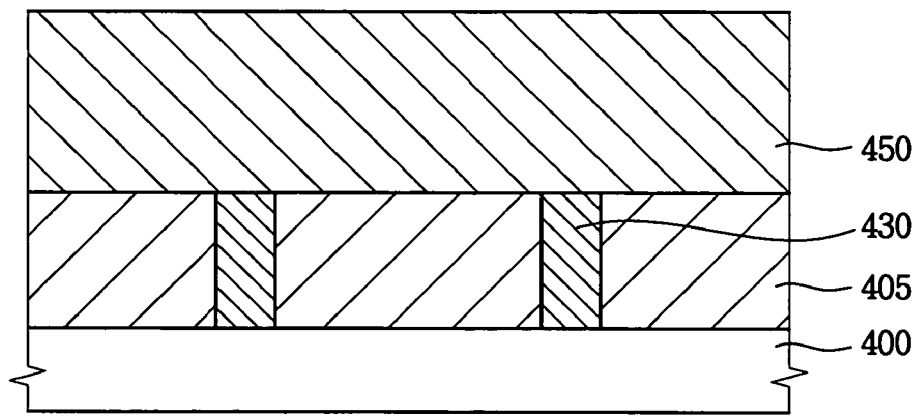
Figure 4C:
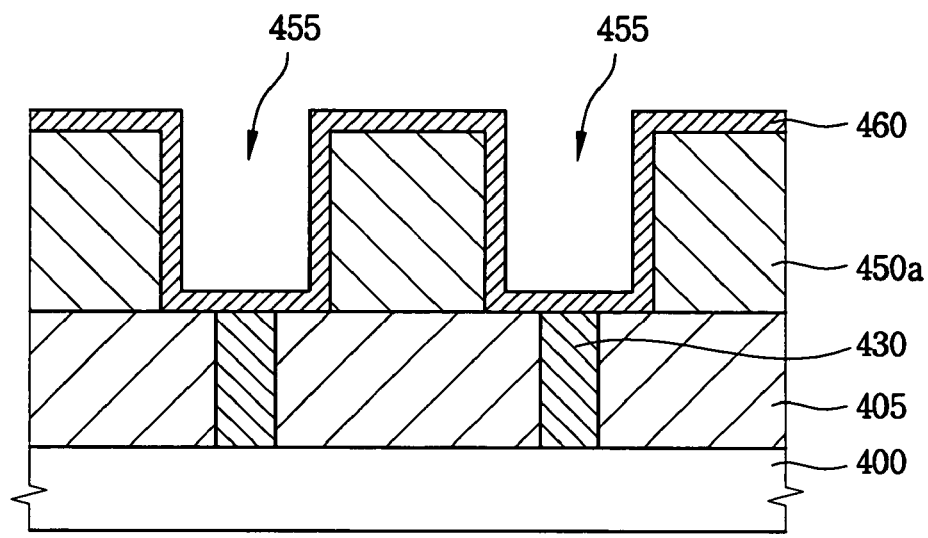

FIG. 4B depicts the first openings 420 of FIG. 4A are filled with a conductive material to form contact plugs 430. Next a second insulating layer 450 is formed on the contact plug 430 and the first insulating layer 405. FIG. 4C illustrates the second insulating layer 450 of FIG. 4B is etched for exposing upper faces of the contact plugs 430 to form a second insulating layer pattern 450a having second openings 455 exposing the contact plugs 430. A polysilicon layer 460 is formed on the second insulating layer pattern 450a to fill the second openings 455. The polysilicon layer 460 is continuously formed on an upper face of the insulating layer pattern 450a. Additionally, the polysilicon layer is formed on the inner walls and bottom faces of the second openings 455.

Figure 4D:
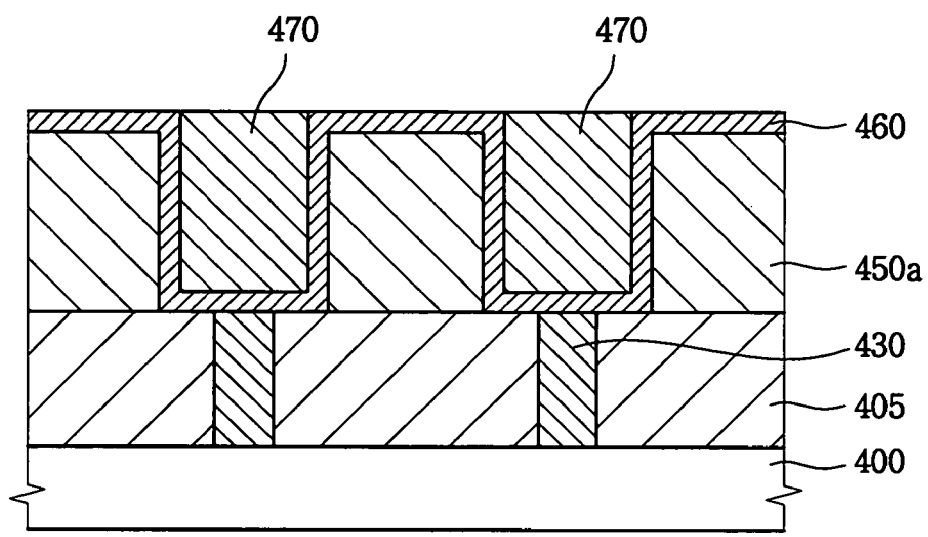

FIG. 4D depicts oxide deposited on the polysilicon layer 460 to fill the second openings 455. The oxide is planarized via a chemical mechanical polishing (CMP) process to form an oxide layer 470 filling the second openings 455 as shown in FIG. 4C.

Figure 4E:
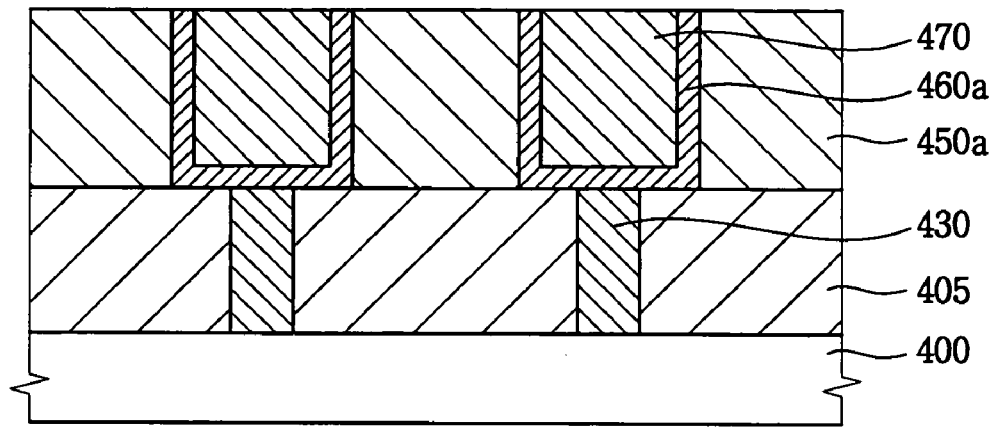

FIG. 4E shows that the polysilicon layer positioned on the second insulating layer pattern 450a is etched to expose the upper face of the second insulating layer pattern 450a. The oxide layer 470 is simultaneously removed by a thickness substantially identical to an etched thickness of the second insulating layer pattern 450a. Accordingly, the second insulating layer pattern 450a divides the polysilicon layer into lower electrodes 460a of capacitors.

Figure 4F:
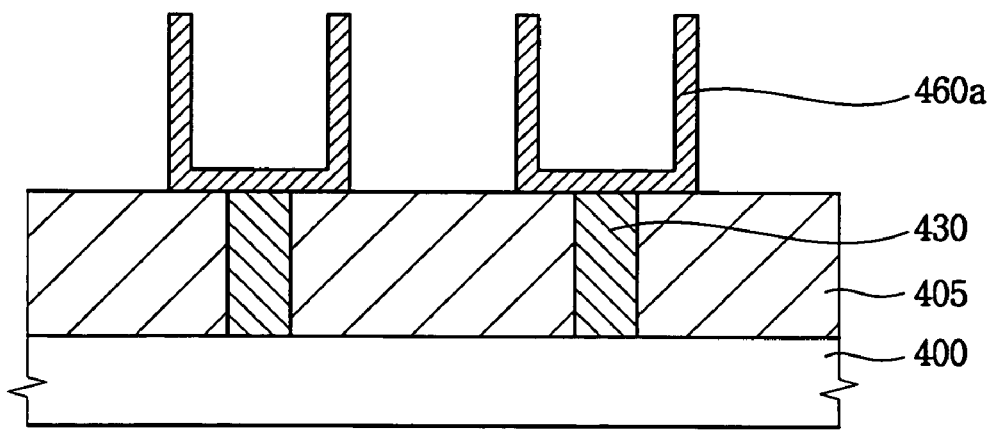
Figure 4G:
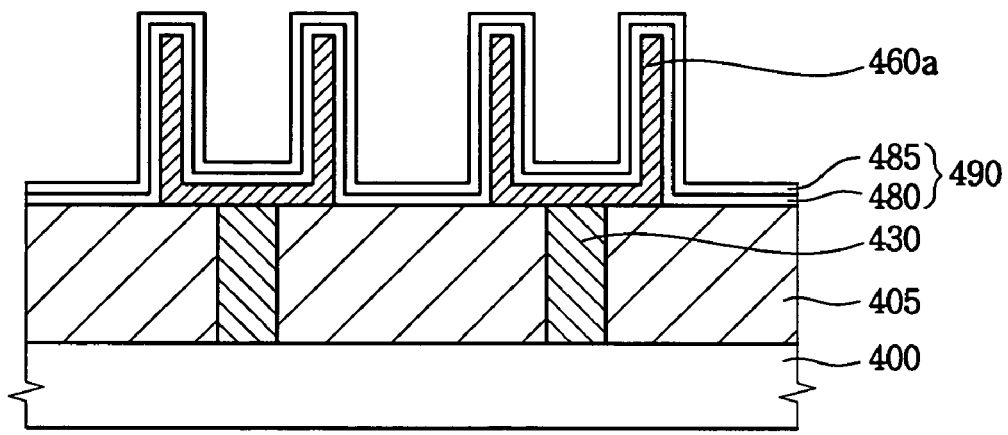

FIG. 4F demonstrates that the oxide layer 470 of FIG. 4E was etched using a wet etching process to expose the lower electrode 460a. FIG. 4G shows the substrate 400 was loaded into a chamber for forming a dielectric layer thereon. Reactants including a first metal precursor are introduced on to the lower electrode 460a to form a first chemisorbed layer 480 in accordance with following reaction equation (7).

$$2Al(CH_3)_3 + O_3 \rightarrow Al_2O_3 + 3C_2H_6 \tag{7}$$

An infrared ray having a wave number for driving Al(CH$_3$)$_3$ is irradiated to Al(CH$_3$)$_3$ to selectively activate Al(CH$_3$)$_3$. Activated Al(CH$_3$)$_3$ is chemisorbed on the substrate 400 and the lower electrode 460a. An infrared ray having a wave number for selectively driving O3 is irradiated to O3 to form the first chemisorbed layer 480 including Al$_2$O$_3$. Reactants including a second metal precursor react according to following reaction equation (8) to form a second chemisorbed layer 485.

$$HfCl_4 + 2H_2O \rightarrow HfO_2 + 4HCl \tag{8}$$

An infrared ray is irradiated to HfCl$_4$ to activate HfCl$_4$. Activated HfCl$_4$ is chemisorbed on the first chemisorbed layer 480. An infrared ray is further irradiated to H$_2$O to form the second chemisorbed layer 485 including H$_2$O so that a dielectric layer 490 including the first and second chemisorbed layers 480 and 485 is formed. The remaining reactants in the chamber were then exhausted.

When the process was completed, the formation of the alternating current field is suspended to lower the temperature of the substrate 400. Since the temperature of the substrate 400 is augmented through the rotary motion of the molecules, the molecules stop rotating when the alternating current is not provided, so that the temperature of the substrate 400 may be rapidly cooled. As a result, the chemisorbtion no longer occurs.

Figure 4H:
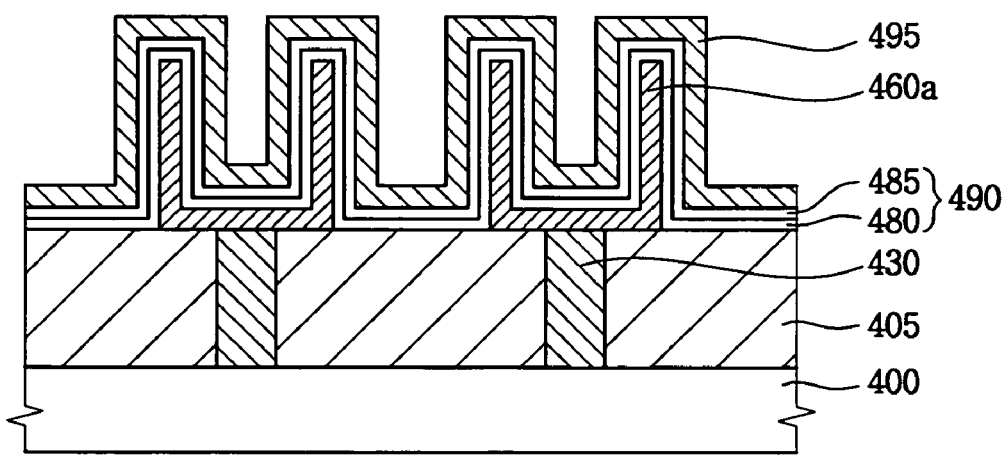

FIG. 4H illustrates an upper electrode 495 formed on the dielectric layer 490 so that the capacitor including the lower and upper electrodes 460a and 495, and the dielectric layer 490 is fabricated.

It should be noted that many variations and modifications might be made to the embodiments described above without substantially departing from the principles of the present invention. All such variations and modifications are intended to be included herein within the scope of the present invention, as set forth in the following claims.

What is claimed is:

1. A method for forming a thin film on a substrate comprising:
    simultaneously providing reactants at a surface of a substrate disposed in a chamber and seguentially providing energies to the reactants to separately activate molecules of the reactants wherein (a) a first energy is provided to the reactants to selectively activate a first reactant among the reactants and the activated first reactant is deposited on the surface of the substrate to form a chemisorbed layer, and (b) a second energy is provided to the reactants comprising the first chemisorbed layer to increase the temperature of the surface of the first chemisorbed layer; and
    depositing a second reactant among the reactants on the first chemisorbed layer to form the thin film.

2. The method according to claim 1, further comprising providing a third energy to selectively activate the thin film.

3. The method according to claim 1, wherein the temperature of the reactants comprising the first chemisorbed layer is lower than a dissociation temperature of a subsequent material deposited on the first chemisorbed layer.

4. The method according to claim 1, wherein the thin film is a first thin film the method further comprising:
    providing a third energy to the reactants comprising the first thin film to increase the temperature of the first thin film;
    depositing a third reactant among the reactants on the first thin film, the temperature of which has been increased, to form a second chemisorbed layer;

providing a fourth energy to the reactants comprising the second chemisorbed layer to increase the temperature of the second chemisorbed layer; and then depositing a fourth reactant among the reactants on the second chemisorbed layer to form a second thin film on the first thin film.

5. The method according to claim 4, further comprising providing energies to the third and fourth reactants to activate the second thin film.

6. The method according to claim 4, wherein a surface of the reactants comprising the second thin film has a temperature lower than a dissociation temperature of a material of the second thin film.

7. The method according to claim 4, wherein the third or fourth energy comprises an alternating current field and/or a light energy.

8. The method according to claim 1, wherein activating the first reactant comprises colliding, vibrating and/or rotating the molecules of the first reactant.

9. The method according to claim 1, wherein the first or second energy comprises an alternating current field and/or a light energy.

10. The method according to claim 9, wherein the first or second reactant has a polarity when the first or second energy comprises the alternating current field.

11. The method according to claim 9, wherein the alternating current field or light energy is produced by a microwave or an infrared ray.

12. A method for forming a thin film on a substrate comprising:
    introducing a first reactant into a chamber;
    providing a first energy to the first reactant to activate the first reactant;
    depositing the activated first reactant on the substrate to form a chemisorbed layer;
    exhausting the first reactant remaining in the chamber;
    introducing a second reactant to the chamber;
    providing a second energy to the chemisorbed layer to increase the temperature of the reactants comprising the chemisorbed layer; and then
    depositing the second reactant on the chemisorbed layer to form a thin film on the substrate.

13. The method according to claim 12, further comprising providing a third energy to a surface of the substrate to activate materials on the substrate.

14. The method according to claim 12, wherein the temperature of the reactants comprising the chemisorbed layer is lower than a dissociation temperature of the reactants deposited on the chemisorbed layer.

15. The method according to claim 12, wherein the thin film is a first thin film, the method further comprising:
    exhausting the second reactant remaining in the chamber;
    introducing a third reactant;
    providing a third energy to the first thin film to increase the temperature of the reactants comprising the first thin film;
    depositing a third reactant on the first thin film, the temperature of which has been increased, to form a second chemisorbed layer;
    exhausting the third reactant remaining in the chamber;
    introducing a fourth reactant;
    providing a fourth energy to the second chemisorbed layer to increase the temperature of the reactants comprising the second chemisorbed layer;
    depositing the fourth reactant on the second chemisorbed layer, the temperature of which has been increased, to form a second thin film on the first thin film; and
    exhausting the fourth reactant remaining in the chamber.

16. The method according to claim 15, further comprising providing a fifth energy to the third and fourth reactants to activate the reactants comprising the second thin film.

17. The method according to claim 15, further comprising repeatedly performing exhausting the second reactant, introducing the third reactant, providing the third energy, depositing the third reactant, exhausting the third reactant, introducing the fourth reactant, providing the fourth energy, and depositing the fourth reactant and exhausting the fourth reactant to form a multi-layer film.

18. The method according to claim 15, wherein the third or fourth energy comprises an alternating current field and/or a light energy.

19. The method according to claim 12, wherein the temperature of the surface of the chemisorbed layer is lower than a dissociation temperature of the reactants deposited on the substrate.

20. The method according to claim 12, wherein activating the first reactant comprises colliding, vibrating and/or rotating the molecules of the first reactant.

21. The method according to claim 12, wherein the first or second energy comprises an alternating current field and/or a light energy.

22. The method according to claim 21, wherein the alternating current field or light energy is produced by a microwave or an infrared ray.

23. The method according to claim 22 further comprising repeatedly performing introducing the second reactant, providing the third energy, providing the fourth energy, and depositing the second reactant to form a multi-layer film.

24. The method according to claim 12, wherein the first or second reactant has a polarity when the first or second energy comprises the alternating current field.

25. A method for forming a thin film on a substrate in a chamber comprising:
    introducing a first reactant to a polar surface of a substrate in a deposition chamber;
    providing a first energy to the substrate to increase the temperature of the substrate;
    providing a second energy to the first reactant to activate the first reactant;
    depositing the first reactant on the surface of the substrate to form a first chemisorbed layer;
    exhausting the first reactant remaining in the chamber;
    providing a second reactant to the chamber;
    providing a third energy to the reactants comprising the first chemisorbed layer to increase the temperature of the reactants comprising the first chemisorbed layer;
    providing a fourth energy to the second reactant to activate the second reactant; and then
    depositing the second reactant on the first chemisorbed layer to form a thin film on the substrate.

* * * * *

UNITED STATES PATENT AND TRADEMARK OFFICE
CERTIFICATE OF CORRECTION

| | |
|---|---|
| PATENT NO. | : 7,005,389 B2 |
| APPLICATION NO. | : 10/814553 |
| DATED | : February 28, 2006 |
| INVENTOR(S) | : Ko et al. |

It is certified that error appears in the above-identified patent and that said Letters Patent is hereby corrected as shown below:

<u>Column 10,</u>
Line 42 should read -- substrate disposed in a chamber and sequentially pro- --

Line 61 should read -- is a first thin film, the method further comprising: --

Signed and Sealed this

Eighteenth Day of July, 2006

JON W. DUDAS
*Director of the United States Patent and Trademark Office*